United States Patent [19]
Komiyama et al.

[11] Patent Number: 6,133,160
[45] Date of Patent: Oct. 17, 2000

[54] METHOD FOR REFORMING UNDERCOATING SURFACE AND METHOD FOR PRODUCTION OF SEMICONDUCTOR DEVICE

[75] Inventors: Hiroshi Komiyama, Tokyo; Kouji Tsukamoto, Mitaka, both of Japan

[73] Assignee: Semiconductor Process Laboratory Co., Ltd., Japan

[21] Appl. No.: 09/095,751

[22] Filed: Jun. 11, 1998

[30] Foreign Application Priority Data

Feb. 27, 1998 [JP] Japan ................................. 10-048188

[51] Int. Cl.[7] .......................... H01L 21/31; H01L 21/469
[52] U.S. Cl. .............................................. 438/761; 438/907
[58] Field of Search ..................................... 438/907, 761

[56] References Cited

U.S. PATENT DOCUMENTS 4,268,348  5/1981  Allison et al. .
5,484,749  1/1996  Maeda et al. .
5,525,551  6/1996  Ohta .

FOREIGN PATENT DOCUMENTS 4359515  12/1992  Japan .
6349817  12/1994  Japan .
 794505   4/1995  Japan .

*Primary Examiner*—Jey Tsai
*Assistant Examiner*—Josetta Jones
*Attorney, Agent, or Firm*—Lorusso & Loud

[57] ABSTRACT

This invention is directed to a method for the reform of an undercoating surface prior to the formation of a prospective film by the CVD technique using a reaction gas containing an ozone-containing gas having ozone contained in oxygen and TEOS. This method comprises the steps of forming an undercoating insulating film on a substrate by the use of a mixed gas consisting of an ozone-containing gas having ozone contained in oxygen in a concentration of not less than 4% and a first silicon-containing gas, and reforming the surface of said undercoating insulating film by exposing said surface to a second silicon-containing gas.

20 Claims, 14 Drawing Sheets

- ● Initial Growth (Flat Part of Layer)
- ■ Abnormal Growth (Pointed Part of Layer)
- □ On Silicon substrate Thermally Oxidized Film

- ● Initial Growth (Flat Part of Layer)
- ■ Abnormal Growth (Pointed Part of Layer)
- □ On Silicon substrate

METHOD FOR REFORMING UNDERCOATING SURFACE AND METHOD FOR PRODUCTION OF SEMICONDUCTOR DEVICE

BACKGROUND OF THE INVENTION

1. Field of the Invention

This invention relates to a method for reforming an undercoating surface prepared for the formation of a film by the CVD (chemical vapor deposition) technique using a reaction gas containing an ozone-containing gas having ozone ($O_3$) contained in oxygen ($O_2$) and tetraethylorthosilicate (TEOS) (hereinafter referred to as "$O_3$/TEOS reaction gas") and a method for the production of a semiconductor device.

2. Description of the Prior Art

The film formed by the CVD technique using the $O_3$/TEOS reaction gas (hereinafter referred to as "$O_3$/TEOS CVD $SiO_2$ film") has the nature of exhibiting high density, a low etching rate, no shrinkage by a heat treatment even at high temperatures, a small water content, and fine flow quality prominently in accordance as the $O_3$ concentration in $O_2$ increases. The silicon oxide film formed by using an $O_3$/TEOS reaction gas containing $O_3$ in a high concentration (hereinafter referred to as "high $O_3$/TEOS reaction gas") will be referred to as "high $O_3$/TEOS CVD $SiO_2$ film" and the silicon oxide film formed by using an $O_3$/TEOS reaction gas containing $O_3$ in a low concentration (hereinafter referred to as "low $O_3$/TEOS reaction gas") will be referred to as "low $O_3$/TEOS CVD $SiO_2$ film" hereinafter.

The high $O_3$/TEOS CVD $SiO_2$ film relies for its quality in a great measure on the condition of the surface of an undercoating layer. Particularly when a high $O_3$/TEOS CVD $SiO_2$ film is formed on the surface of a $SiO_2$ film or a $Si_3N_4$ film, for example, the film undergoes abnormal growth and acquires a porous texture and a coarse surface as illustrated in FIG. 1 and suffers a decline in the growth rate of a film.

In contrast, when a low $O_3$/TEOS CVD $SiO_2$ film is formed on the surface of an undercoating layer, such abnormal growth as is observed in the high $O_3$/TEOS CVD $SiO_2$ film does not occur in this low $O_3$/TEOS CVD $SiO_2$ film. The low $O_3$/TEOS CVD $SiO_2$ film, however, is inferior in such film qualities as density to the high $O_3$/TEOS CVD $SiO_2$ film.

For the purpose of forming a film of fine flow shape and high quality and conferring on the film an ability to be buried satisfactorily in a narrow depressed area, therefore, it is necessary to form the high $O_3$/TEOS CVD $SiO_2$ film in such a manner as is not affected by the condition of the surface of an undercoating layer.

Heretofore, the following methods have been adopted for the purpose of depriving a high $O_3$/TEOS CVD $SiO_2$ film prior to its formation of the dependency thereof on the surface of an undercoating film.

(1) A first method consists in exposing the surface of an undercoating layer 120 to plasma as illustrated in FIG. 2A. On the undercoating layer 120 which has been reformed consequently, a high $O_3$/TEOS CVD $SiO_2$ film 121 is formed as illustrated in FIG. 2B.

(2) A second method consists in forming on an undercoating layer 130 a plasma $SiO_2$ film 131 as an undercoating insulating film by the plasma CVD technique as illustrated in FIG. 3A. Thus, a high $O_3$/TEOS CVD $SiO_2$ film 132 is formed on the undercoating insulating film 131 as illustrated in FIG. 3B.

The plasma $SiO_2$ film 131 is enabled to acquire satisfactory adaptability for the high $O_3$/TEOS CVD $SiO_2$ film 132 in terms of the formation of a film, depending on the condition of the film formation adopted by the plasma CVD technique during the formation of the plasma $SiO_2$ film 131. When the plasma $SiO_2$ film 131 of fine adaptability is formed as an undercoating insulating film on the surface of the undercoating layer 130 and then the high $O_3$/TEOS CVD $SiO_2$ film 132 is formed on the plasma $SiO_2$ film 131, therefore, the high $O_3$/TEOS CVD $SiO_2$ film 132 consequently obtained acquires fine film qualities.

(3) A third method consists in forming on the surface of an undercoating layer 140 a low $O_3$/TEOS CVD $SiO_2$ film 141 as an undercoating insulating film or forming an $O_3$/TEOS CVD $SiO_2$ film under a low pressure (hereinafter referred to as "low pressure $O_3$/TEOS CVD $SiO_2$ film") 141 as illustrated in FIG. 4A. A high $O_3$/TEOS CVD $SiO_2$ film 142 is formed as illustrated in FIG. 4B on the undercoating insulating film 141. The high $O_3$/TEOS CVD $SiO_2$ film 142 is easily formed because manifests fine adaptability for the low $O_3$/TEOS CVD $SiO_2$ film or the low pressure $O_3$/TEOS CVD $SiO_2$ film 141.

The conventional methods mentioned above, however, severally encounter the following problems.

(1) With the method which resorts to the exposure of the surface of the undercoating layer 120 to plasma, the success thereof in eliminating the dependency on the surface of the undercoating layer 120 is at the mercy of varieties of the surface of the unndercoating layer 120 and the condition of the emission of plasma. The condition of the plasma emission, therefore, cannot be common and standardized inclusively for all kinds of undercoating layer 120 but must be optimized with respect to the status of an individual undercoating layer 120.

(2) In the case of the method which forms the plasma $SiO_2$ layer 131 as an undercoating insulating film, the plasma $SiO_2$ film 131 has too inferior step coverage to suit application to such an undercoating layer as is furnished with fine and deep grooves.

(3) In the case of the method which forms the low $O_3$/TEOS CVD $SiO_2$ film 141 or the low pressure $O_3$/TEOS CVD $SiO_2$ film 141 as an undercoating insulating film in preparation for the formation of the high $O_3$/TEOS CVD $SiO_2$ film 142, the low $O_3$/TEOS CVD $SiO_2$ film 141 possesses an isotropic film-forming property and requires a thickness of not less than 100 nm for the purpose of averting the influence of the dependency on the surface of the undercoating layer. This film, therefore, is unfit for application to an undercoating layer which is furnished with fine and deep grooves, for example. The low $O_3$/TEOS CVD $SiO_2$ film 141 is unfit for an undercoating insulating film because it has low density as compared with the high $O_3$/TEOS CVD $SiO_2$ film.

SUMMARY OF THE INVENTION

This invention has for an object thereof the provision of a method for the reform of an undercoating surface which can be applied even to an undercoating layer possessed of a fine and deep groove (such as, for example, a trench, gap between metal wiring layers, and gap between metal lower layers) while averting the influence of the dependency on the surface of the undercoating layer and a method for the production of a semiconductor device without reference to the condition of the surface of the undercoating layer.

According to the method of this invention for the reform of an undercoating surface, an undercoating insulating film is formed on a substrate prior to the formation of a prospective film and then the surface of the undercoating insulating film is exposed to a silicon-containing gas such as, for example, an alkoxy silane or silanol.

Since the undercoating insulating film is formed on the substrate prior to the formation of the prospective film, the influence of the dependency on the surface of the substrate can be averted without reference to the condition of the surface of the substrate.

Further, the surface of the undercoating insulating layer is reformed by exposing the surface of the undercoating insulating film to the silicon-containing gas. In this case, the method for reforming the surface can be inclusively fallen into common and standardized because it is not the inherent surface of a substrate which is held to possess a surface condition different from one species to another but the surface of the undercoating insulating film formed on the surface of the substrate that is subjected to the reform.

Consequently, when the prospective film is to be formed on the undercoating insulating film, an insulating film, for example, can be formed on the undercoating insulating film without being affected by the influence of the dependency on the undercoating surface because the surface of the undercoating insulating film has been already reformed.

Since the undercoating insulating film is formed by the use of an ozone-containing gas having ozone contained in a high concentration, the undercoating insulating film acquires a dense texture and the minimum thickness of the undercoating insulating film at which the influence of the dependency on the surface of the substrate ceases to manifest itself permits a further decrease.

Since the undercoating insulating film can be formed in a decreased thickness, the undercoating insulating film can be infallibly formed on a substrate possessed of a depressed area of unusually narrow width on the order of 0.1 $\mu$m such as, for example, a trench, gap between metal wiring layers, and gap between metal lower layers as supported by the results of an inventor's experiment.

It has been found that particularly when an undercoating insulating film is formed on the surface of a substrate possessing a depressed area of very narrow width by the use of an ozone-containing gas and TEOS, the undercoating insulating film consequently obtained excels in flatness, step coverage, and burying property and manifests high density as well.

According to the method of this invention for the production of a semiconductor device, an under coating insulating film is formed on a substrate prior to the formation of an insulating film, then the surface of the undercoating insulating film is reformed by exposing the surface to a first silicon-containing gas, and the insulating film is formed on the reformed surface. By this reason, this method can be applied even to a substrate possessing a fine and deep groove (such as, for example, a trench, gap between metal wiring layers, and gap between metal lower layers) and can be used for forming an insulating film of fine quality without being affected by the influence of the dependency on the surface of the substrate.

Particularly when the surface of an undercoating insulating film is exposed to a mixed gas of an ozone-containing gas having ozone contained in a low concentration of not more than 1% and a silicon-containing gas such as, for example, TEOS and an insulating film is formed on the undercoating insulating film by the use of an ozone-containing gas having ozone contained in a high concentration of not less than 4% and TEOS, the undercoating insulating film and the insulating film constitute themselves a favorable combination enjoying highly satisfactory adaptability for each other from the standpoint of film formation.

Further, if the same silicon-containing gas is used throughout the entire process of film formation, the step of forming the undercoating insulating film, the step of reforming the surface of the undercoating insulating film, and the step of forming the insulating film on the undercoating insulating film can be continuously carried out in one and the same chamber by simply starting and stopping the stream of ozone gas. In this while, the substrate can be continuously heated at one and the same temperature. As a result, the process can be simplified.

DESCRIPTION OF THE PREFERRED EMBODIMENT

Now, the method for reforming an undercoating surface prior to the formation of a prospective film and the method for the production of a semiconductor device according to the mode of embodying this invention will be described below with reference to the drawings annexed hereto.

(Background Originating This Invention)

When a silicon oxide film is formed on a thermally oxidized film by the use of an ozone-containing gas having ozone contained in a high concentration and TEOS, the silicon oxide film to be grown yields to abnormal growth owing to the dependency of this growth on the surface of the thermally oxidized film.

A detailed observation of this process of growth reveals that the growth seems to proceed through such stages as illustrated in FIGS. 7A–7E. The diagrams are cross sections illustrating the manner in which the steps of process advance from the initial stage through the completion of the film formation sequentially in the order of their occurrence.

Figure 7A:
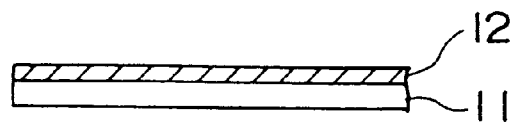
FIGS. 7A to 7E are cross section to aid in the description of a background which has originated this invention.
Figure 7B:
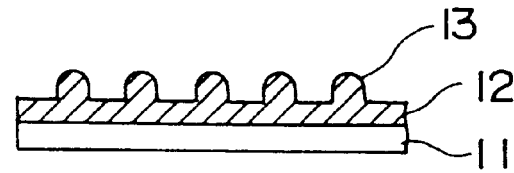

A flat silicon oxide film is formed during the initial stage of film formation as illustrated in FIGS. 7A and 7B. Seeds are formed on this film after the thickness of the film has increased to a level greater than 20 to 50 nm.

Figure 7C:
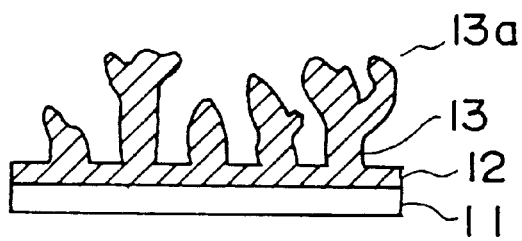

When the growth of the film is continued, the growth will now continue exclusively from these seeds. These seeds consequently form the structure of a so-called disperse forest as illustrated in FIG. 7C because the seeds are alienated mutually.

Figure 7D:
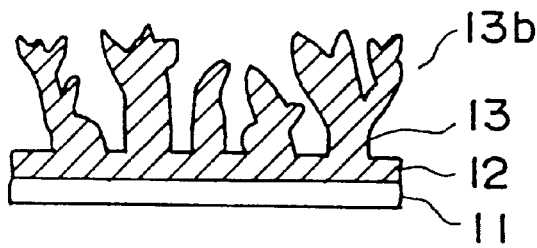

When the growth is further continued, the layers grown from the individual seeds are each ramified into a plurality of layers of growth and the whole growing film is transformed into a so-called thick forest as illustrated in FIG. 7D.

Figure 7E:
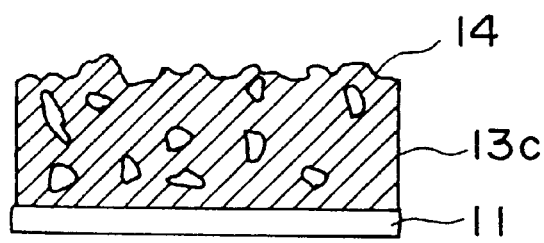

When the growth is continued further, the layers of growth ramified from the adjacent seeds mutually contact as illustrated in FIG. 7E. The gaps which occur between the layers of growth remain unburied and turn into voids after the formation of film.

Figure 8A:
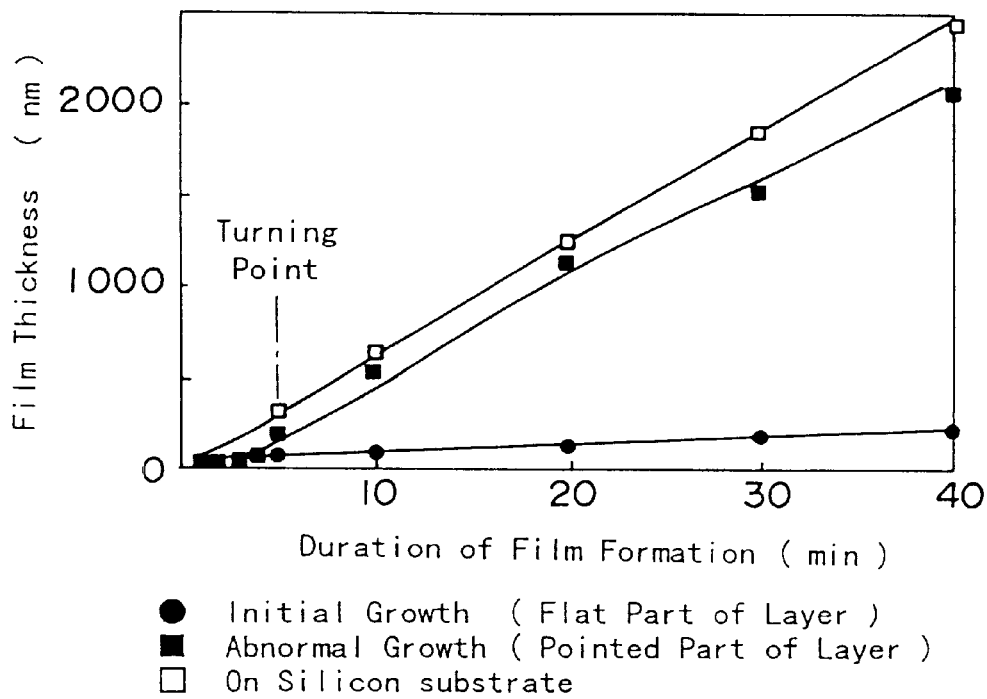
FIG. 8A is a graph illustrating the growth rate of film in the process for the formation of a high $O_3$/TEOS CVD $SiO_2$ film, depicting the background originating this invention.

FIG. 8A is a graph illustrating the growth rate of film during the process of film formation mentioned above. In this graph, the horizontal axis is a linear scale of the duration of film formation (in minutes) and the vertical axis a linear scale of the thickness of film (in nm).

Figure 8B:
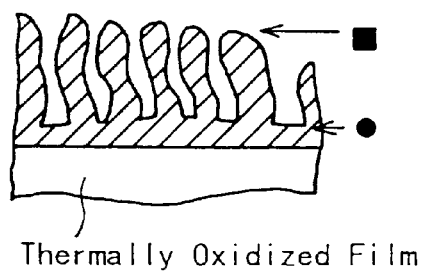
FIG. 8B is a cross section illustrating respective definitions of the thickness of the initial growth layer and that of the abnormal growth layer.

In FIG. 8A, the filled circular marks denote the thickness of layer of initial growth and the filled square marks denote the total thickness of growing film inclusive of the layer of abnormal growth. The respective definitions of the thicknesses thereof are shown in FIG. 8B. The data has stemmed from the films invariably formed on a thermally oxidized film. Incidentally, the open square marks denote the thickness of the film directly formed on a silicon substrate.

The results shown in FIG. 8A and 8B clearly indicate that the flat layer of initial growth attains virtually no growth throughout the entire course of film growth.

Figure 9:
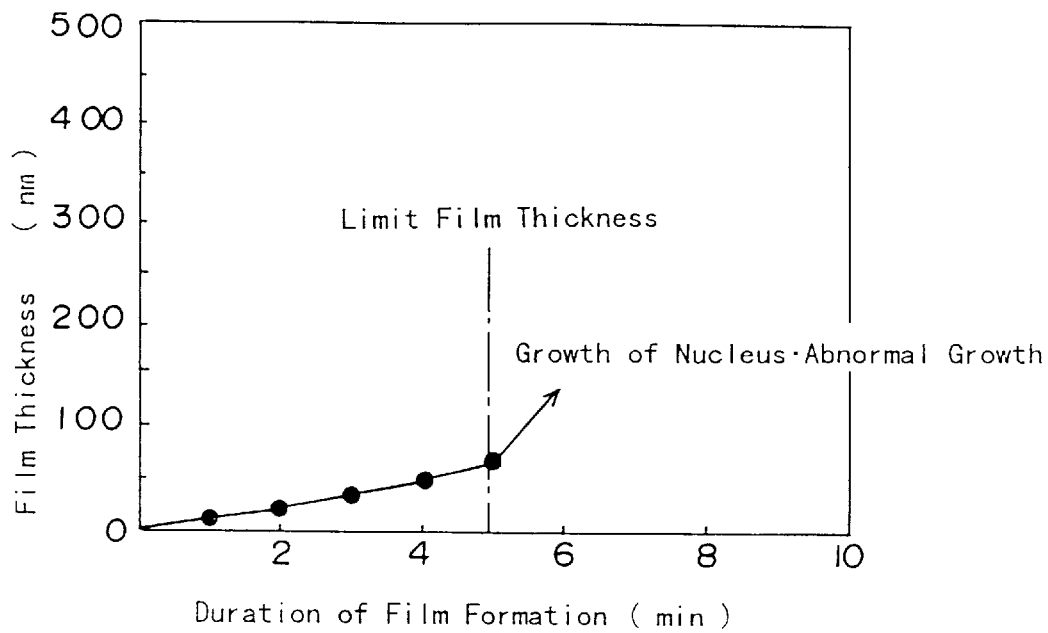
FIG. 9 is a graph illustrating the growth rate of film of an initially grown layer, portraying the detail of FIG. 8A.

FIG. 9 depicts the outcome of a detailed observation of the process of formation of the layer of initial growth during the first five minutes of the time of film formation, as part of the graph of FIG. 8 illustrating the growth rate of film. In the graph, the horizontal axis is the linear scale of the time of film formation (in minutes) and the vertical axis is a linear scale of the thickness of film (in nm).

In FIG. 9, the designation "limit film thickness" means the duration of film formation and the thickness of film which exist when the formation of the layer of initial growth is completed and the growth of seeds is started.

The data in the present case indicates that the duration of film formation is 5 minutes and the thickness of the film at that time is in the neighborhood of 50 nm. Incidentally, the limit film thickness of this flat layer of initial growth is generally in the approximate range of 20 to 50 nm, though it is variable with the conditions of film formation, for example.

As the layer of initial growth, a flat layer of a uniform thickness is formed prior to the occurrence of abnormal growth as described above. Since the layer of initial growth has been formed by the use of a gas having ozone contained in a high concentration, it is thought to have fine quality as a film. This invention consists in utilizing this layer of initial growth as an undercoating insulating film.

This invention is characterized in using an undercoating layer which is obtained by further exposing the surface of the layer of initial growth to the vapor of TEOS or an alkoxy silane or silanol. The layer of initial growth, on exposure to the vapor of an alkoxy silane or silanol, has the dependency on surface altered for the sake of improvement. The vapor of TEOS, for example, is supplied as contained in N$_2$ gas.

Figure 10:
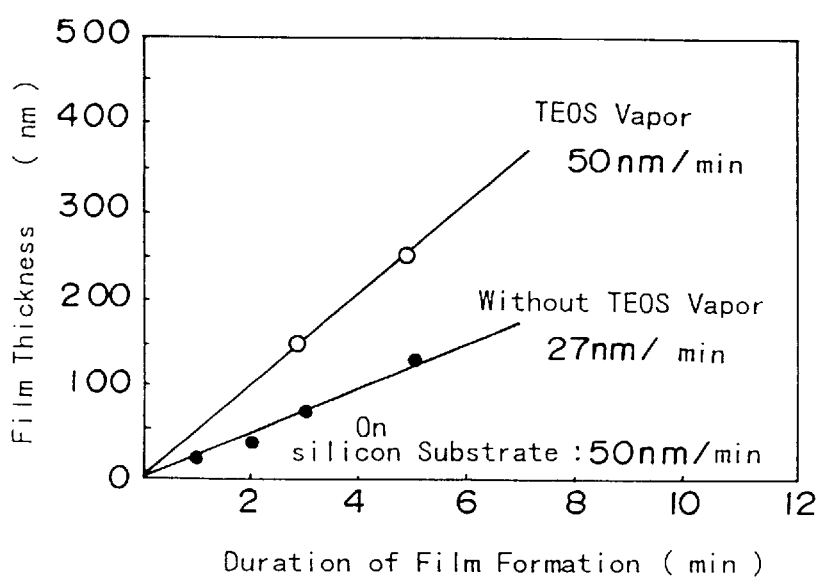
FIG. 10 is a graph illustrating the difference in the growth rate of film due to the presence or absence of the treatment with TEOS vapor on an undercoating insulating film, depicting the background originating this invention.

FIG. 10 is a graph illustrating the results of a comparative experiment performed for the purpose of confirming the effect of the treatment with the vapor of TEOS. The experiment consisted in examining how the growth rate of a high O$_3$/TEOS CVD SiO film on the layer of initial growth was affected by the presence or absence of the treatment of the surface of the layer of initial growth with the vapor of TEOS. In the graph, the horizontal axis is a linear scale of the duration of film formation (in minutes) and the vertical axis is a linear scale of the thickness of film (in nm).

The open circle marks denote the results obtained when the surface of the layer of initial growth was treated with N$_2$ gas containing the vapor of TEOS (hereinafter referred to as "TEOS vapor") and the filled circle marks those obtained when the treatment mentioned above was omitted.

It is clearly noted from FIG. 10 that the treatment with the TEOS vapor enabled the growth rate to reach a level nearly on a par with the growth rate, 50 nm, on the silicon substrate. That is to say, the treatment resulted in cancelling the dependency on surface.

Optionally, the surface of the layer of initial growth may be exposed to a mixed gas of an ozone-containing gas having ozone contained in oxygen in a low concentration of not more than 1% and TEOS instead of being exposed to the vapor of an alkoxy silane or silanol.

Figure 11:
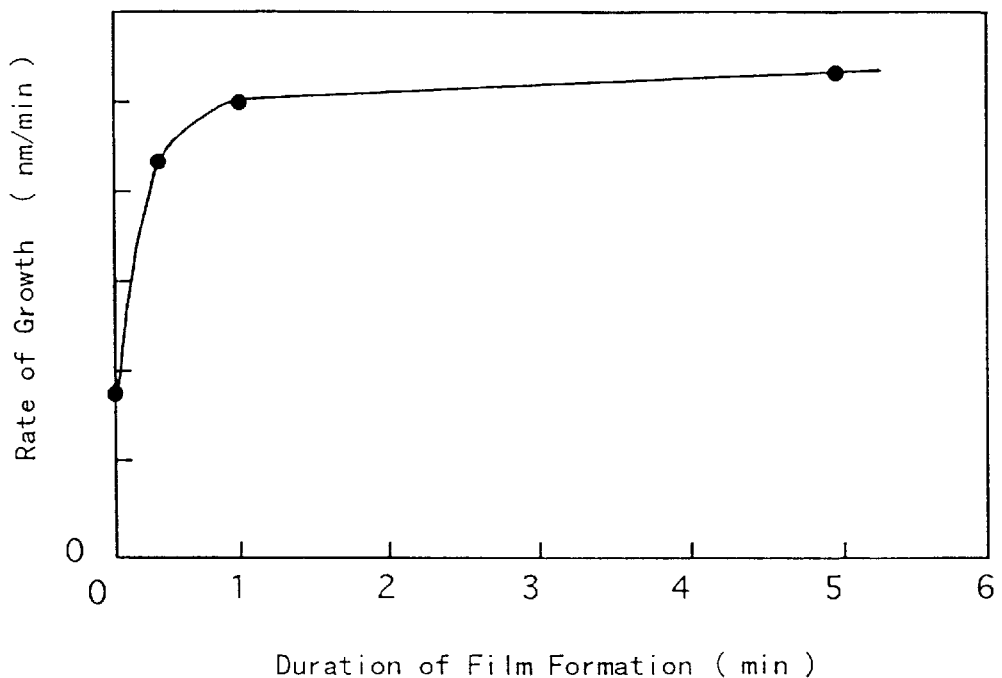
FIG. 11 is a graph illustrating the relation between the duration of treatment with TEOS vapor on an undercoating insulating film and the growth rate of film, depicting the background originating this invention.

FIG. 11 is a graph illustrating the relation between the duration of treatment with the TEOS vapor and the growth rate of film. In this graph, the horizontal axis is a linear scale of the duration of treatment (in minutes) and the vertical axis is the linear scale of the growth rate of film (in nm/min.).

It is clearly noted from the results shown in FIG. 11 that though the growth rate in about one minute of the duration of treatment reached a level nearly on a par with the growth rate, 50 nm, on the silicon substrate, the duration of treatment was preferred to exceed 3 minutes.

Figure 12:
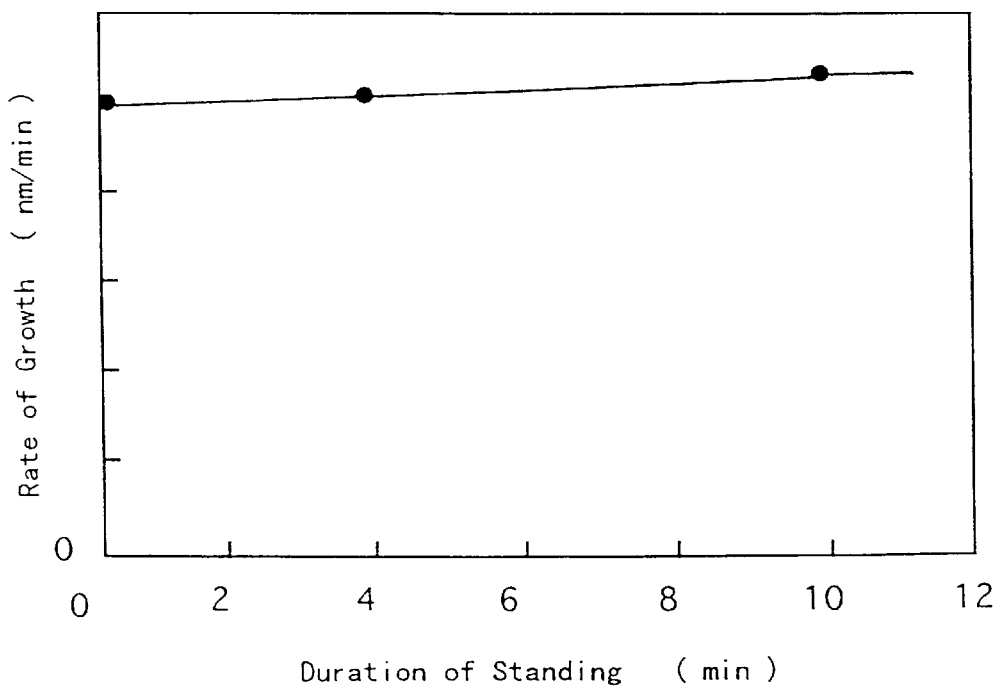
FIG. 12 is a graph illustrating the results of a survey conducted on the continuity of the effect of the treatment with TEOS vapor on an undercoating insulating film, depicting the background originating this invention.

FIG. 12 is a graph illustrating the results of a survey conducted on the continuity of the effect of the treatment with the TEOS vapor. In the graph, the horizontal axis is a linear scale of the duration of standing (in minutes) and the vertical axis is a linear scale of the growth rate (in nm/min.).

It is clearly noted from the results shown in FIG. 12 that when the duration of standing was within 10 minutes which was the maximum duration set for the survey, the growth rate continued to be nearly on a par with the growth rate, 50 nm, on the silicon substrate, indicating that the effect of the treatment was maintained. Though the survey was not performed for any duration beyond 10 minutes, the results seem to imply that the effect of the treatment was maintained for a fairly long duration.

Figure 13:
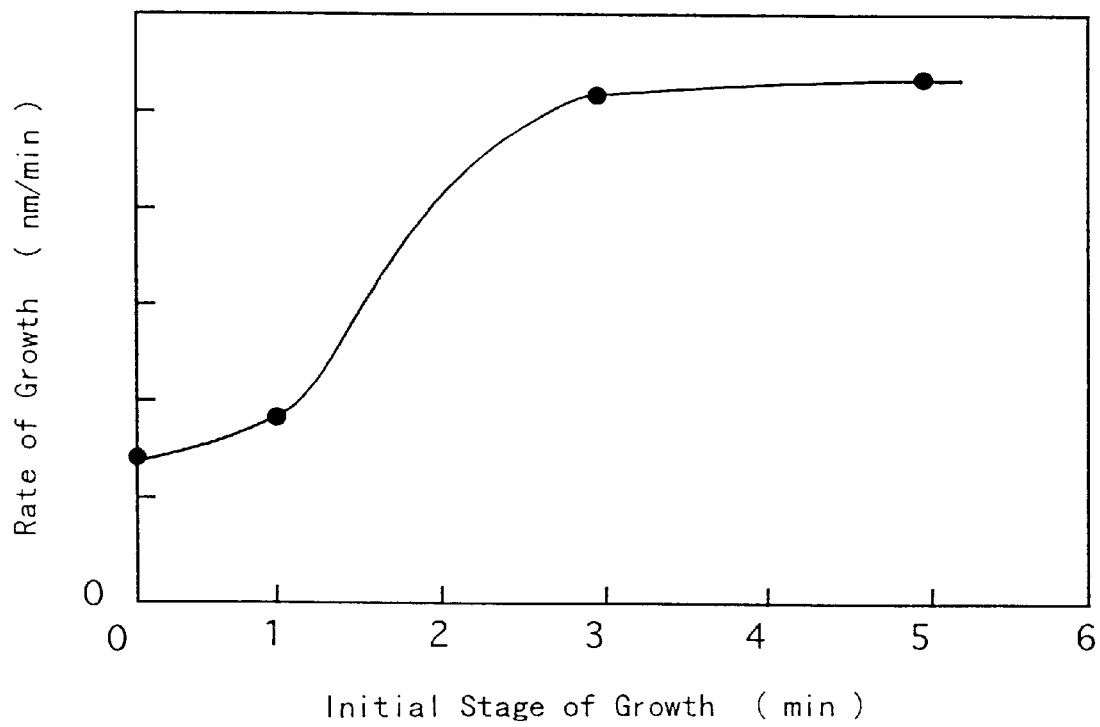
FIG. 13 is a graph illustrating the relation between the duration of formation of an undercoating insulating film and the growth rate of a high $O_3$/TEOS CVD $SiO_2$ film formed on the undercoating insulating film, depicting the background originating this invention.

FIG. 13 is a graph illustrating the results of a survey conducted to find the thickness of the layer of initial growth to be required for elimination of the dependency on the surface. In the graph, the horizontal axis is a linear scale of the duration of growth measured from the initial stage of growth (in minutes) and the vertical axis is a linear scale of the growth rate of a high $O_3$/TEOS CVD $SiO_2$ film on the layer of initial growth (in nm/min.).

It is clearly noted from the results shown in FIG. 13 that when the duration of film formation was beyond 3 minutes, the growth rate of film was nearly on a par with the growth rate, 50 nm, on the silicon substrate. This fact implies that the thickness of the layer of initial growth had its optimum value between 20 and 50 nm. Though the thickness of the layer at which the generation of seeds starts varies with the condition of the surface of the film being formed, it is safe to make a rule of using a thickness of not more than 50 nm.

(First Embodiment)

Now, a method for the production of a semiconductor by the use of a method for reforming an undercoating surface according to the first embodiment of this invention will be explained below with reference to FIG. 5 and FIG. 6.

Figure 1:
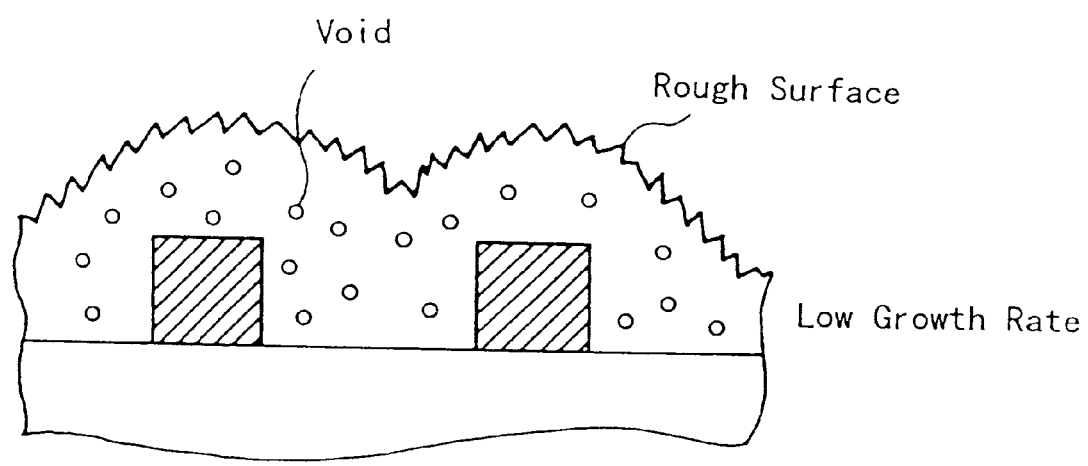
FIG. 1 is a cross section illustrating abnormal growth occurring during the formation of a high $O_3$/TEOS CVD $SiO_2$ film on the surface of a $SiO_2$ film or $Si_3N_4$ film according to the conventional technique.
Figure 2A:
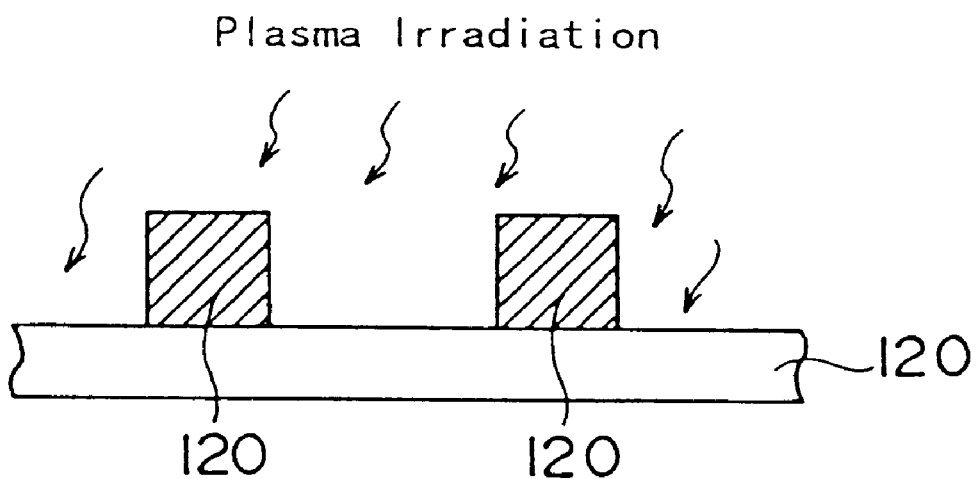
FIGS. 2A and 2B are cross sections illustrating a method of the conventional technique for the reform of an undercoating surface.
Figure 2B:
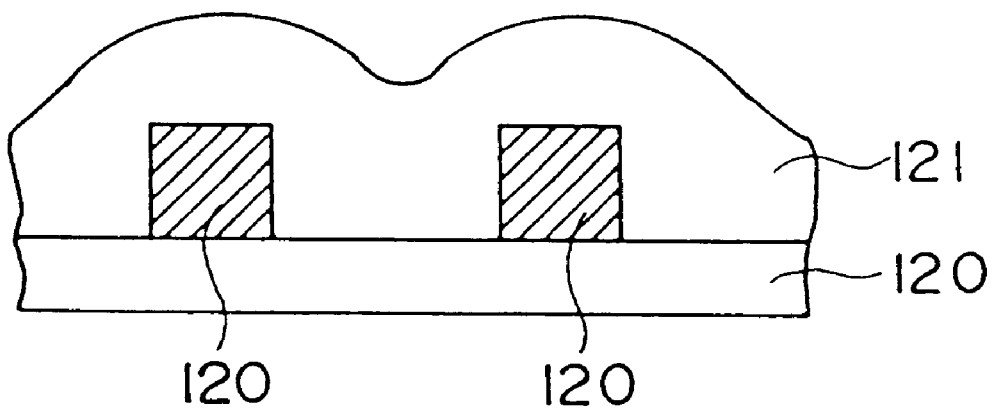
Figure 3A:
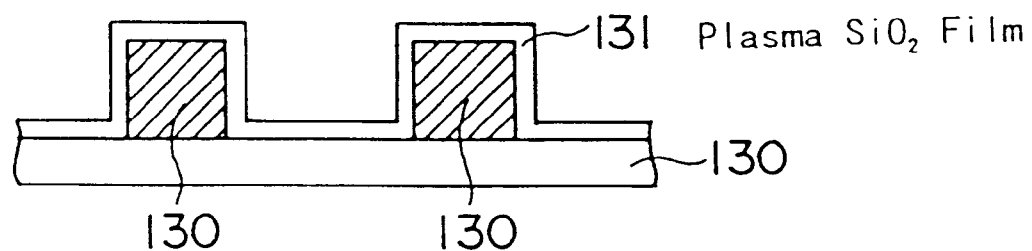
FIGS. 3A and 3B are cross sections illustrating another method of the conventional technique for the reform of an undercoating surface.
Figure 3B:
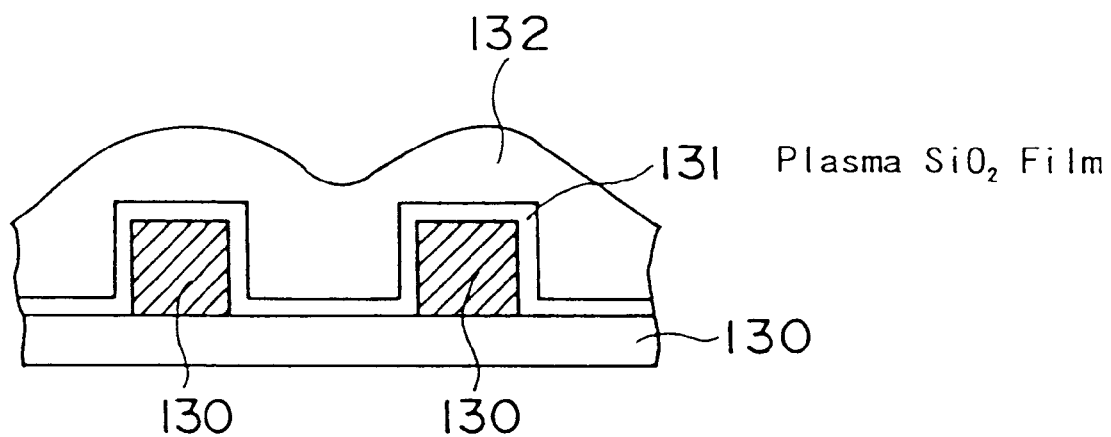
Figure 4A:
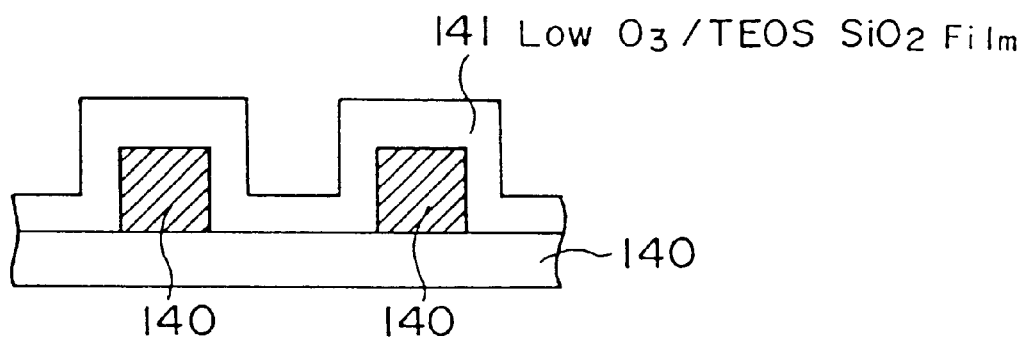
FIGS. 4A and 4B are cross sections illustrating yet another method of the conventional technique for the reform of an undercoating surface.
Figure 4B:
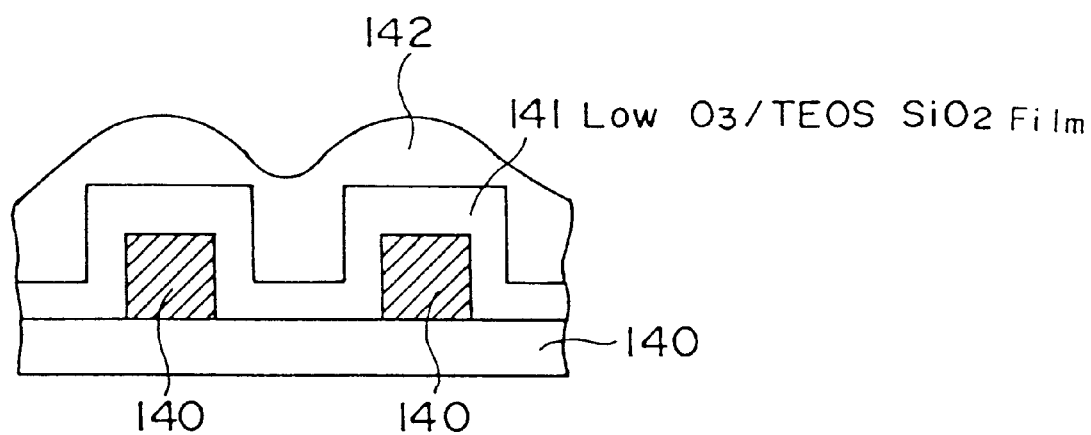
Figure 5:
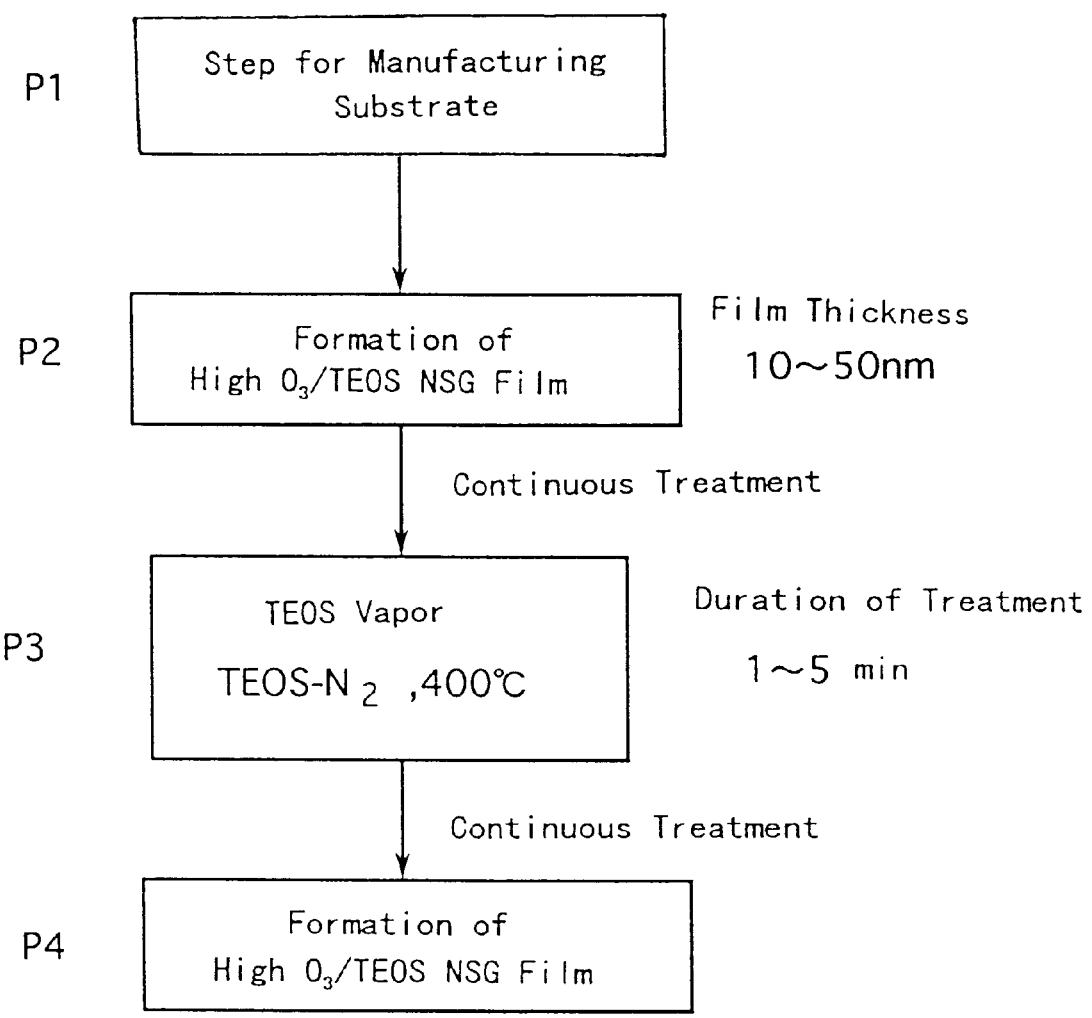
FIG. 5 is a flow chart illustrating a method for the production of a semiconductor device by the use of a method for the reform of an undercoating surface in the mode of the first embodiment of this invention.

FIG. 5 is a flow chart illustrating a method for the production of a semiconductor device by the use of a method for reforming an undercoating surface in the mode of the first embodiment of this invention.

FIGS. 6A–6E are cross sections illustrating a method for the production of a semiconductor device by the use of the method for reforming an undercoating surface in the mode of the first embodiment of this invention.

To begin with, the step of P1 will be described. P1 is a step for manufacturing a substrate for the formation of a film.

Figure 6A:
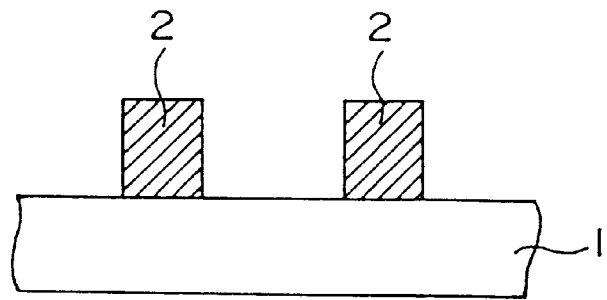
FIGS. 6A to FIG. 6E are cross sections illustrating a method for the production of a semiconductor device by the use of a method for the reform of an undercoating surface in the mode of the first embodiment of this invention.

A polysilicon film is formed on a silicon wafer 1 and then the polysilicon film is patterned to give rise to wiring layers 2 as illustrated in FIG. 6A. This patterning is performed so as to interpose a gap of 0.5 $\mu$m between the adjacent wiring layers 2.

Figure 6B:
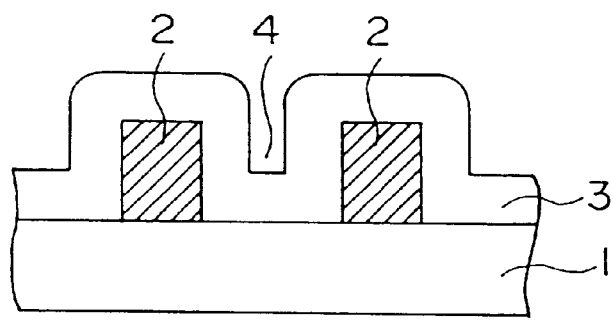

Then, a silicon nitride film ($Si_3N_4$ film) 3, 200 nm in thickness, is formed so as to cover the silicon wafer 1 and the wiring layers 2 as illustrated in FIG. 6B. As a result, a groove (depressed part) 4 covered with a $Si_3N_4$ film 3, 0.1 $\mu$m in width and 0.5 $\mu$m in depth, is formed between the adjacent wiring layers 2. The components mentioned above construct the substrate.

Next, the step of P2 will be described. P2 is a step for forming an undercoating laminating film on the substrate by the use of a mixed gas of an ozone-containing gas having ozone contained in a high concentration and TEOS.

First, the $Si_3N_4$ film is heated at the temperature of 400° C. Then, while the temperature is maintained, the surface of the $Si_3N_4$ film is exposed to a mixed gas of an ozone-containing gas having ozone contained in a high concentration of not less than 4% with TEOS (hereinafter referred to as "high $O_3$/TEOS reaction gas").

Figure 6C:
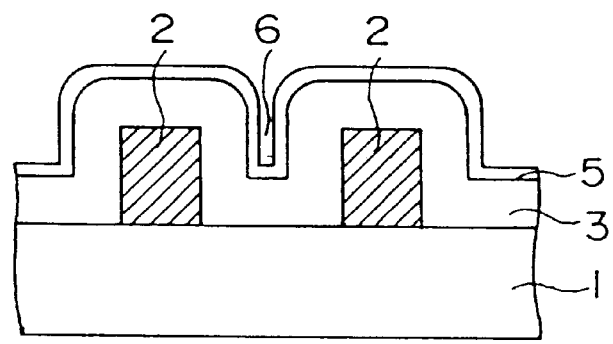

After the elapse of a prescribed duration, a high $O_3$/TEOS CVD $SiO_2$ film (undercoating insulating film) 5 is formed on the surface of the $Si_3N_4$ film 3 as illustrated in FIG. 6C.

At this time, the high $O_3$/TEOS CVD $SiO_2$ film 5 is so formed that the thickness thereof may be not less than 10 nm and the surface thereof may not allow formation of seeds thereon. The impartation of such a small thickness as 10 nm to the high $O_3$/TEOS CVD $SiO_2$ film 5 is intended for covering the interior of the groove 4 of narrow width without sacrificing the step coverage to be manifested to the groove 4 of narrow width. The use of 10 nm as the lower limit is intended for evading the influence of the dependency on the surface of the substrate.

Further, since the high $O_3$/TEOS CVD $SiO_2$ film 5 is formed inside the groove 4 which is covered with the $Si_3N_4$ film 3, a groove 6 covered with the high $O_3$/TEOS CVD $SiO_2$ film 5 measures 80 nm in width and 490 nm in depth.

Figure 6D:
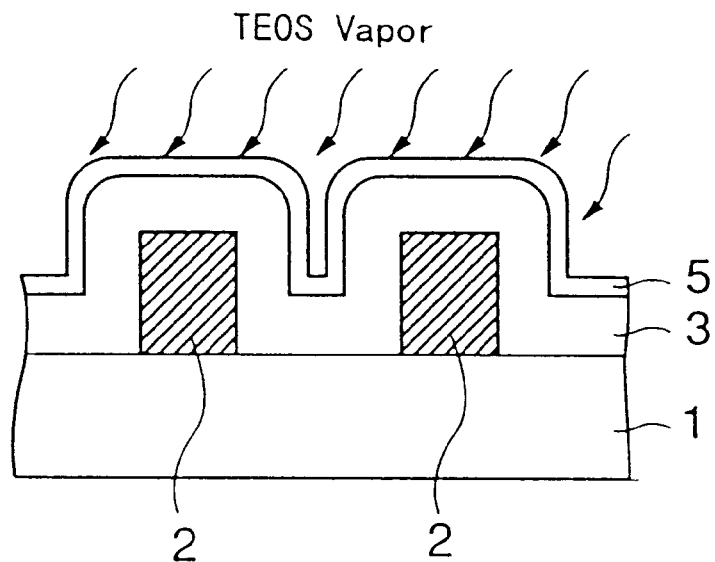

Then, the step of P3 will be described below. P3 is a step for reforming the surface of the undercoating insulating film 5. The high $O_3$/TEOS CVD $SiO_2$ film 5 is heated at the temperature of 350° C. and then while maintaining the temperature, the surface of the high $O_3$/TEOS CVD $SiO_2$ film 5 is exposed to the TEOS vapor for a period in the approximate range of one to five minutes to reform the surface of the high $O_3$/TEOS CVD $SiO_2$ film 5 as illustrated in FIG. 6D.

At this time, since the surface of the $Si_3N_4$ film 3 is covered with the high $O_3$/TEOS CVD $SiO_2$ film 5, the reform is required to be performed exclusively on the surface of the high $O_3$/TEOS CVD $SiO_2$ film 5 without reference to the kind of undercoating film. Thus, the conditions for the reform of the undercoating surface can be inclusively fallen into common and standardized.

Further, since the high $O_3$/TEOS CVD $SiO_2$ film 5 is dense in texture inherently, it can be made to avert the influence of the dependency on the surface of the $Si_3N_4$ film 3, notwithstanding the thickness of the high $O_3$/TEOS CVD $SiO_2$ film 5 is decreased up to 10 nm. The reform of the surface, therefore, can be effected on a substrate possessing of a fine and deep groove, for example.

Now, the step of P4 will be described below. P4 is a step for forming a high $O_3$/TEOS CVD $SiO_2$ film on the undercoating insulating film 5.

Figure 6E:
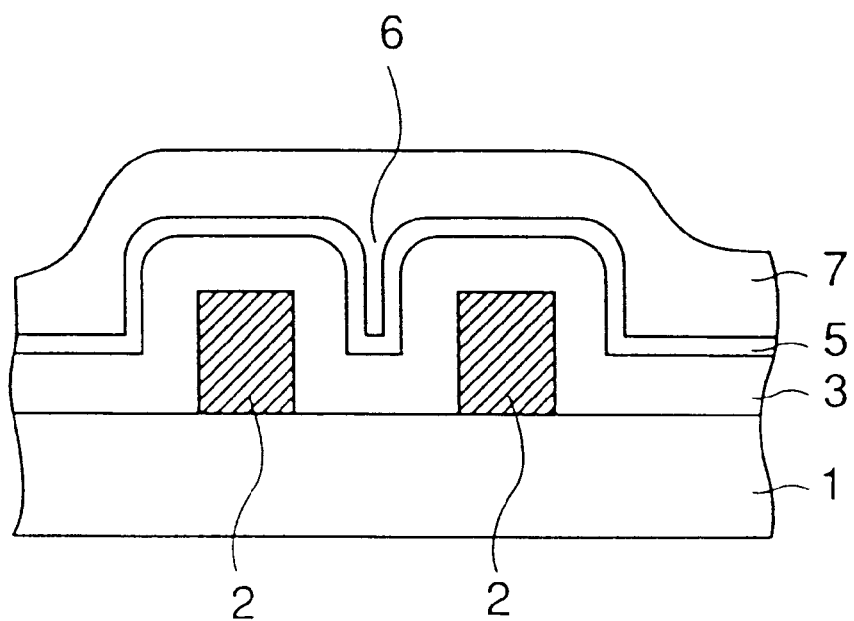

The high $O_3$/TEOS CVD $SiO_2$ film 5 is heated at the temperature of 400° C. and then a high $O_3$/TEOS CVD $SiO_2$ film 7 is formed on the surface of the high $O_3$/TEOS CVD $SiO_2$ film 5 by the plasma CVD technique using a mixed gas of an ozone-containing gas having ozone contained in a high concentration of not less than 4% with TEOS (hereinafter referred to as "high $O_3$/TEOS reaction gas") as illustrated in FIG. 6E. At this time, the high $O_3$/TEOS CVD $SiO_2$ film 7 completely fills the interior of the groove 6 and covers the high $O_3$/TEOS CVD $SiO_2$ film 5 completely.

The high $O_3$/TEOS CVD $SiO_2$ film 5 coats the surface of the $Si_3N_4$ film 3 to avert the influence of the dependency on the surface of the $Si_3N_4$ film 3 and reforms the surface of the high $O_3$/TEOS CVD $SiO_2$ film 5. For this reason, the high $O_3$/TEOS CVD $SiO_2$ film 7 can be formed infallibly on the high $O_3$/TEOS CVD $SiO_2$ film 5 without inducing the generation of abnormal growth.

Though the present embodiment, as described above, uses the high $O_3$/TEOS CVD $SiO_2$ film 5 as an undercoating insulating film, this invention allows use of any film selected from among PSG (phosphosilicate glass) film, BSG (borophosphosilicate glass) film, and BPSG (borophosphosilicate glass) film instead.

A mixed gas of $O_3$ and TEOS with TMP (trimethylphosphite: $P(OCH_3)_3$) or TMOP (trimethylphosphate: $PO(OCH_3)_3$) can be used as the gas for forming the PSG film, a mixed gas of $O_3$ and TEOS with TMB (trimethylborate: $B(OCH_3)_3$) can be used as the gas for forming the BSG film, and a mixed gas of $O_3$ and TEOS and TMB with TMP or TMOP can be used as the gas for forming the BPSG film.

When a film selected from among PSG film, BSG film, BPSG film, and low-pressure $O_3$/TEOS $SiO_2$ film is formed, the $Si_3N_4$ film 3 is heated at the temperature of not lower than 350° C.

While the surface of the undercoating insulating film 5 is undergoing the treatment with the TEOS vapor, the temperature of the heated surface of the undercoating insulating film 5 is only required to exceed normal room temperature and is preferred to be in the range of 100° C.–400° C.

Though the formation of the high $O_3$/TEOS CVD $SiO_2$ film 7, as described above, uses 400° C. as the temperature of the surface of the undercoating insulating film 5, this invention only requires this temperature to be not lower than 350° C.

Though the reform of the surface, as described above, uses TEOS as the gas for the reform, this invention allows use of an alkoxy silane, silanol, etc. instead.

(Second Embodiment)

Figure 14:
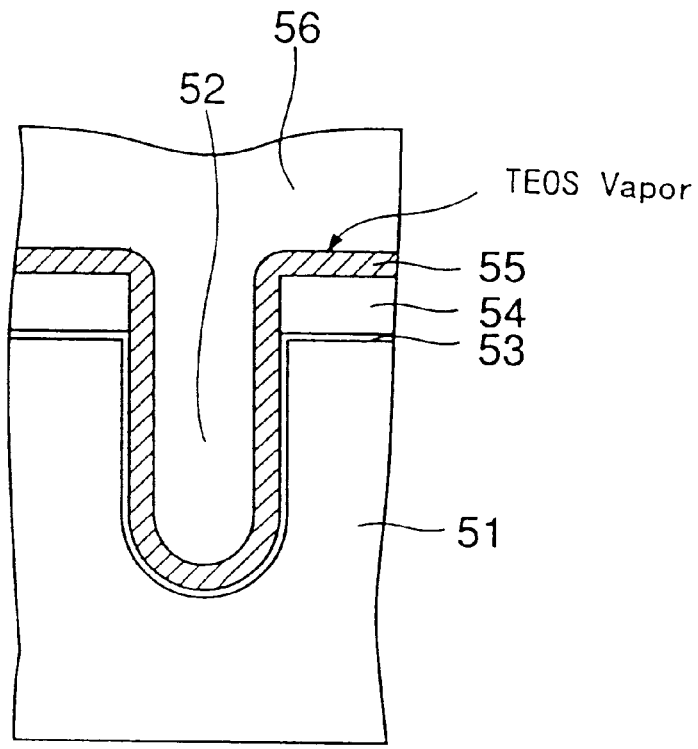
FIG. 14 is a cross section illustrating a case of applying this invention to a trench as an embodiment of this invention.

FIG. 14 is a cross section illustrating a method for the reform of an undercoating surface according to the second embodiment of this invention.

In the present embodiment, a trench (depressed part) 52, 0.1 μm in width, is formed on a silicon wafer 51 and then an undercoating insulating film is formed so as to cover the trench 52. Thereafter, the undercoating insulating film is tested for flatness, step coverage, and burying property and manifests high density as well.

To begin with, a silicon oxide film ($SiO_2$ film) 53 of a small thickness is formed on the silicon wafer 51 and then a $Si_3N_4$ film 54 is formed on the $SiO_2$ film 53.

Then, the superposed films are patterned to remove the parts of the $Si_3N_4$ film 54 and $SiO_2$ film 53 which are destined to form the trench over a width of 150 nm.

Then, with the patterned $Si_3N_4$ film 54 and $SiO_2$ film 53 as masks, the silicon wafer 52 is etched to form a trench 52, 150 nm in width.

Then, the $SiO_2$ film 53 is formed as connected to the flat part of the $SiO_2$ film 53 by thermal oxidation on the surface of the silicon wafer 51 exposed inside the trench 52. The steps mentioned above complete the construction of a substrate.

Then, a high $O_3$/TEOS CVD $SiO_2$ film 55 is formed uniformly in a thickness of 10 nm on the $SiO_2$ film 53 and the $Si_3N_4$ film 54 and, with the flow of the $O_3$ gas stopped and the flow of the $N_2$ gas containing the TEOS vapor continued, the surface of the high $O_3$/TEOS CVD $SiO_2$ film 55 is exposed to the TEOS vapor to reform the surface of the high $O_3$/TEOS CVD $SiO_2$ film 55.

Then, a high $O_3$/TEOS CVD $SiO_2$ film 56 is formed on the surface of the high $O_3$/TEOS CVD $SiO_2$ film 55 by resuming the flow of the $O_3$ gas in addition to the $N_2$ gas containing the TEOS vapor.

In this case, since the same silicon-containing gas is used throughout the entire process of production, the step of forming the high $O_3$/TEOS CVD $SiO_2$ film 55, the step of reforming the surface of the high $O_3$/TEOS CVD $SiO_2$ film 55, and the step of forming the high $O_3$/TEOS CVD $SiO_2$ film 56 on the high $O_3$/TEOS CVD $SiO_2$ film 55 can be continuously carried out in one and the same chamber by simply starting and stopping the stream of ozone gas. In this while, the substrate can be continuously heated at one and the same temperature.

The present experiment has demonstrated that the high $O_3$/TEOS CVD $SiO_2$ film 55 is allowed to coat the surface of the substrate exposing the different materials and, therefore, enabled to avert the influence of the dependency on the surface due to the exposure of different materials.

Since the high $O_3$/TEOS CVD $SiO_2$ film 55 is allowed to decrease the thickness thereof, it can be formed in a narrow depressed area such as, for example, a trench of not more than 100 nm.

Further, the undercoating insulating film uses the high $O_3$/TEOS CVD SiO film 55, it excels in flatness, step coverage, and burying property.

This invention, therefore, can be applied to a substrate which is possessed of a narrow depressed area such as, for example, a fine and deep groove.

(Third Embodiment)

Figure 15:
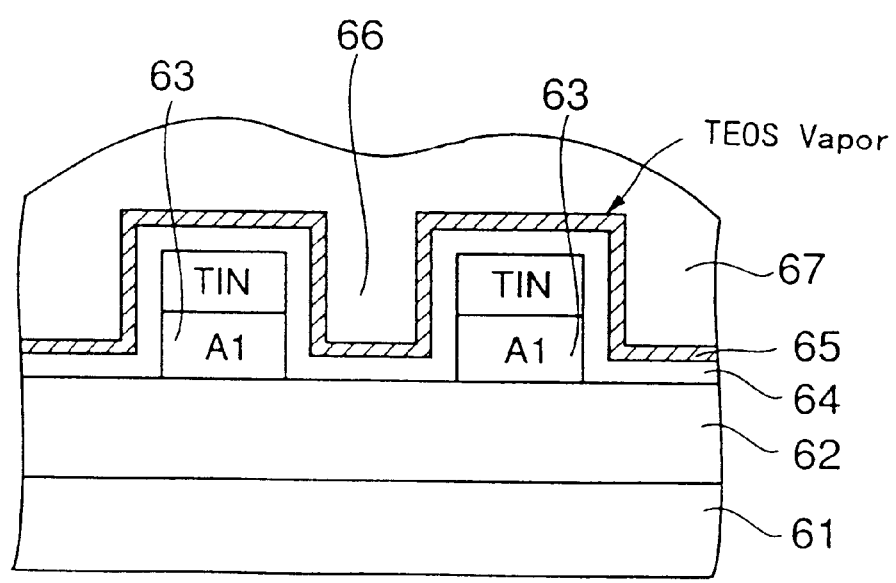
FIG. 15 is a cross section illustrating a case of applying this invention to a gap between metal wiring layers coated with a plasma SiO$_2$ film according to an embodiment of this invention.

FIG. 15 is a cross section illustrating a method for reforming an undercoating surface according to the third embodiment of this invention and a method for the production of a semiconductor device by the use of the method for reform.

In the present embodiment, this invention is applied to a substrate which is composed of a wiring layer formed on an insulating film overlying a silicon wafer 61 and a plasma $SiO_2$ film coating the wiring layer.

To begin with, a $SiO_2$ film 62 is formed on the silicon wafer 61 and then wiring layers 63 made of Al and TiN are formed on the $SiO_2$ film 62.

Then, a plasma $SiO_2$ film 64 is formed in a thickness of 0.1 μm so as to coat the wiring layers 63. The plasma $SiO_2$ film 64 plays the role of protecting the wiring layers against moisture.

Then, a high $O_3$/TEOS CVD $SiO_2$ film 65, 0.05 μm in thickness, is formed on the plasma $SiO_2$ film 64 inside and outside a groove 66 produced along the adjacent wiring layers 63. At this time, the high $O_3$/TEOS CVD $SiO_2$ film 65 is formed in a uniform thickness throughout the entire length because it manifests a fine adaptability to the undercoating layer.

Then, the surface of the high $O_3$/TEOS CVD $SiO_2$ film 65 is reformed by exposing the surface of the high $O_3$/TEOS CVD $SiO_2$ film 65 to an $N_2$ gas containing the vapor of TEOS. Subsequently, a high $O_3$/TEOS CVD $SiO_2$ film 67 is formed on the surface of the high $O_3$/TEOS CVD $SiO_2$ film 65 inside and outside the groove 66.

Again in this case, the step of forming the high $O_3$/TEOS CVD SiO film 65, the step of reforming the surface of the high $O_3$/TEOS CVD $SiO_2$ film 65, and the step of forming the high $O_3$/TEOS CVD $SiO_2$ film 67 on the high $O_3$/TEOS CVD $SiO_2$ film 65 can be continuously carried out in one and the same chamber. In this while, the substrate is continuously heated at one and the same temperature.

This experiment demonstrates that the high $O_3$/TEOS CVD $SiO_2$ film 65 can be formed in a narrow depressed area intervening between the adjacent wiring layers coated with the plasma $SiO_2$ film because it is allowed to decrease the thickness of the high $O_3$/TEOS CVD $SiO_2$ film 65.

Further, owing to the use of the high $O_3$/TEOS CVD $SiO_2$ film 65 of the quality mentioned above, the high $O_3$/TEOS CVD $SiO_2$ film 65 formed in the depressed area excels in flatness, step coverage, and burying property.

The present invention, therefore, can be applied to a substrate which is possessed of a narrow depressed area such as, for example, a fine and deep groove.

(Fourth Embodiment)

Figure 16:
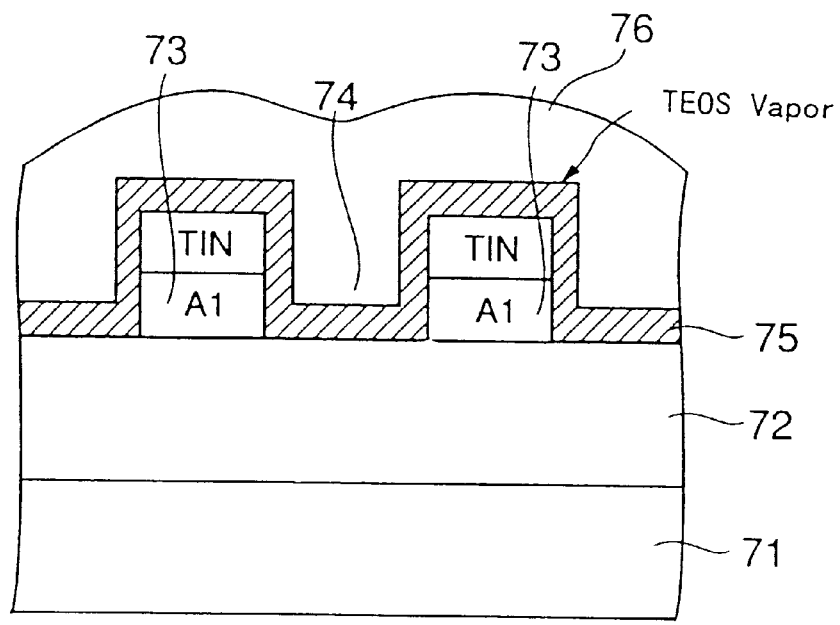
FIG. 16 is a cross section illustrating a case of applying this invention to a gap between metal wiring layers formed of different materials according to an embodiment of this invention.

FIG. 16 is a cross section illustrating a method for reforming an undercoating surface according to the fourth embodiment of this invention and a method for the production of a semiconductor device by the use of the method for reform.

In the present embodiment, the present invention is applied to a substrate which is composed of an insulating film of a semiconductor substrate and wiring layers formed on the insulating film as separated with a narrow intervening gap. Further, an undercoating insulaing film is formed on the substrate so as to cover and directly contact wiring layers. In short, an undercoating insulating film is formed directly on a substrate which exposes the different materials of an insulating film and a conductor film in the surface thereof.

To begin with, a $SiO_2$ film 72 is formed on a silicon wafer 71 and wiring layers 73 made of Al and Tin are formed further on the $SiO_2$ film 72. These wiring layers 73 are so formed as to interpose a gap of 250 nm between the adjacent wiring layers 73. The components mentioned above construct the substrate.

Then, a high $O_3$/TEOS CVD $SiO_2$ film 75, 20 nm in thickness, is formed on the $SiO_2$ film 72 so as to coat the wiring layers 73. At this time, the high $O_3$/TEOS CVD $SiO_2$ film 75 is formed in a uniform thickness inside and outside a groove 74 intervening between the adjacent wiring layers 73 because the high $O_3$/TEOS CVD $SiO_2$ film 75 is not markedly susceptible of the influence of the dependency on the undercoat.

Then, the surface of the high $O_3$/TEOS CVD $SiO_2$ film 75 is reformed by exposing the surface of the high $O_3$/TEOS CVD $SiO_2$ film 75 to an $N_2$ gas containing the vapor of TEOS. Subsequently, a high $O_3$/TEOS CVD $SiO_2$ film 76 is formed on the surface of the high $O_3$/TEOS CVD $SiO_2$ film 75 inside and outside the groove 74.

Again in this case, the step of forming the high $O_3$/TEOS CVD $SiO_2$ film 75, the step of reforming the surface of the high $O_3$/TEOS CVD $SiO_2$ film 75, and the step of forming the high $O_3$/TEOS CVD $SiO_2$ film 76 on the high $O_3$/TEOS CVD $SiO_2$ film 75 can be continuously carried out in one and the same chamber. In this while, the substrate is continuously heated at one and the same temperature.

This experiment demonstrates that the dependency on the surface due to the exposure of different materials can be curbed because the high $O_3$/TEOS CVD $SiO_2$ film 75 coats the surface of the substrate exposing the different materials in the surface thereof. As a result, the high $O_3$/TEOS CVD $SiO_2$ film 76 can be formed on the high $O_3$/TEOS CVD $SiO_2$ film 75 without being affected by the influence of the dependency on the surface.

Further, since the high $O_3$/TEOS CVD $SiO_2$ film 75 is allowed to decrease the thickness thereof, it can be formed in a narrow depressed area intervening between the adjacent wiring layers. Further, the high $O_3$/TEOS CVD SiO film 75 formed in the depressed area excels in flatness, step coverage, and burying property. The present invention, therefore, can be applied to the reform of the surface of a substrate which is possessed of a narrow depressed area such as, for example, a fine and deep groove.

(Fifth Embodiment)

Figure 17:
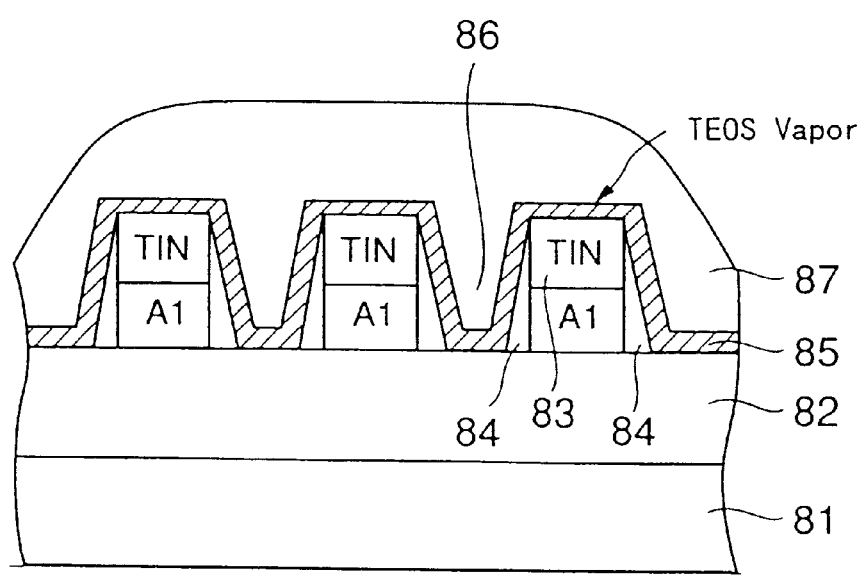
FIG. 17 is a cross section illustrating a case of applying this invention to a gap between metal lower layers having provided in the lateral parts of wiring layers with a side wall spacer according to an embodiment of this invention.

FIG. 17 is a cross section illustrating a method for reforming an undercoating surface according to the fifth embodiment of this invention. In the present embodiment, the undercoating insulating film is formed to coat the wiring layers which are provided on the lateral parts of the wiring layers with side wall spacers. The side wall spacers moderate the difference of step which is formed when the undercoating insulating film is coated.

To begin with, a $SiO_2$ film 82 is formed on a silicon wafer 81 and then wiring layers 83 made of Al and Tin are formed on the $SiO_2$ film 82. The wiring layers 83 are formed so as to interpose a gap of 100 nm between the adjacent wiring layers 83.

Then, a $SiO_2$ (or $Si_3N_4$) film is formed so as to coat the wiring layers 83 and then the superposed layers are anisotropically etched to form side wall spacers 84 on the opposite lateral side surfaces of the wiring layers 83. As a result, the lateral sides of the wiring layers 83 are diverged downward and enabled to moderate the difference of step. A groove is consequently formed between the opposed side wall spacers 84. The components described above construct the substrate.

Then, a high $O_3$/TEOS CVD $SiO_2$ film 85, 10 nm in thickness, is formed so as to coat the wiring layers 83. At this time, the high $O_3$/TEOS CVD $SiO_2$ film 85 is formed in a uniform thickness inside and outside the groove.

Then, the surface of the high $O_3$/TEOS CVD $SiO_2$ film 85 is reformed by exposing the surface of the high $O_3$/TEOS CVD $SiO_2$ film 85 to a $N_2$ gas containing the vapor of TEOS.

Then, a high $O_3$/TEOS CVD $SiO_2$ film 87 is formed on the surface of the high $O_3$/TEOS CVD $SiO_2$ film 85 inside and outside a groove 86.

Again in this case, the step of forming the high $O_3$/TEOS CVD $SiO_2$ film 85, the step of reforming the surface of the high $O_3$/TEOS CVD $SiO_2$ film 85, and the step of forming the high $O_3$/TEOS CVD $SiO_2$ film 87 on the high $O_3$/TEOS CVD $SiO_2$ film 85 can be continuously carried out in one and the same chamber. In this while, the substrate is continuously heated at one and the same temperature.

As a result, the dependency on the surface due to the exposure of different materials can be curbed because the high $O_3$/TEOS CVD $SiO_2$ film 85 coats the surface of the substrate which exposes the different materials in the surface thereof. The high $O_3$/TEOS CVD $SiO_2$ film 86 can be formed on the high $O_3$/TEOS CVD $SiO_2$ film 85 without being affected by the influence of the dependency on the surface.

Further, since the high $O_3$/TEOS CVD $SiO_2$ film 85 is allowed to decrease the thickness thereof, it can be formed in a narrow depressed area intervening between the adjacent wiring layers. Further, the high $O_3$/TEOS CVD $SiO_2$ film 85 formed in the depressed area excels in flatness, step coverage, and burying property. The present invention, therefore, can be applied to the reform of the surface of a substrate which is possessed of a narrow depressed area such as, for example, a fine and deep groove.

According to the method of this invention for the reform of an undercoating surface, the undercoating insulating film is formed on the substrate prior to the formation of a prospective film and the surface of the undercoating insulating film is further exposed to the first silicon-containing gas as described above.

Since the undercoating insulating film is formed on the substrate prior to the formation of the prospective film, the influence of the dependency on the surface of the substrate can be avoided without reference to the condition of the surface of substrate.

Further, the surface of the undercoating insulating film can be reformed because the surface of the undercoating insulating film is exposed to the first silicon-containing gas. In this case, the method for reforming the surface can be inclusively fallen into common and standardized because it is not the inherent surface of a substrate but the surface of the undercoating insulating film formed on the surface of the substrate that is subjected to the reform.

When an insulating film is to be formed on the undercoating insulating film, therefore, the insulating film can be formed on the undercoating insulating film without being affected by the influence of the dependency on the undercoating surface because the surface of the undercoating insulating film has already been reformed.

Further, since the undercoating insulating film is formed by the use of the first ozone-containing gas having ozone contained in a high concentration, the undercoating insulating film possesses a dense texture and allows a decrease in the thickness thereof without succumbing to the influence of the dependency of the surface of the substrate.

As a result, the undercoating insulating film can be formed on a substrate which is possessed of a depressed area of unusually narrow width. Particularly when the undercoating insulating film is formed on the surface of a substrate possessed of a depressed area of very narrow width by the use of the first ozone-containing gas and the first silicon-containing gas, the undercoating insulating film to be obtained consequently excels in flatness, step coverage, and burying property and manifests high density of texture.

Further, according to the method of this invention for the production of a semiconductor device, the undercoating insulating film is formed on the substrate prior to the formation of the insulating film, then the surface of the undercoating insulating film is reformed by exposure to the first silicon-containing gas, and the insulating film is formed on the reformed surface.

This method, therefore, can be applied to a substrate possessed of a fine and deep groove, for example, and enabled to form an insulating film of fine quality without being affected by the influence of the dependency on the surface of the substrate.

Particularly when the surface of the undercoating insulating film is exposed to an ozone-containing gas having ozone contained in a low concentration of not more than 1% and TEOS and then the insulating film is formed on the undercoating insulating film by the use of an ozone-containing gas having ozone contained in a high concentration of not less than 4% and TEOS, the undercoating insulating film and the insulating film manifest very satisfactory adaptability to each other from the standpoint of film formation.

What is claimed is:

1. A method for the reform of an undercoating surface comprising the steps of:

forming an undercoating insulating film on a substrate by the use of a mixed gas consisting of an ozone-containing gas having ozone contained in oxygen in a concentration of not less than 4% and a first silicon-containing gas; and exposing the surface of said undercoating insulating film to a second silicon-containing gas thereby reforming said surface.

2. A method according to claim 1, wherein said first silicon-containing gas and said second silicon-containing gas contain the same substance.

3. A method according to claim 2, wherein said step for forming said undercoating insulating film and said step for reforming the surface of said undercoating insulating film are continuously carried out.

4. A method according to claim 1, wherein a silicon oxide film or a silicon nitride film is exposed in the surface of said substrate.

5. A method according to claim 1, wherein said undercoating insulating film has a flat surface.

6. A method according to claim 1, wherein said substrate is continuously heated while the surface of said undercoating insulating film is exposed to said second silicon-containing gas.

7. A method according to claim 1, wherein said first silicon-containing gas is an alkoxy silane or silanol.

8. A method according to claim 1, wherein said first silicon-containing gas and said second silicon-containing gas are severally an alkoxy silane or silanol.

9. A method for the reform of an undercoating surface comprising the steps of:

forming an undercoating insulating film on a substrate by the use of a mixed gas consisting of a first ozone-containing gas having ozone contained in oxygen in a concentration of not less than 4% and a third silicon-containing gas; and exposing the surface of said undercoating insulating film to a mixed gas consisting of a second ozone-containing gas having ozone contained in oxygen in a concentration of not more than 1% and a fourth silicon-containing gas thereby reforming said surface.

10. A method according to claim 9, wherein a silicon oxide film or a silicon nitride film is exposed in the surface of said substrate.

11. A method according to claim 9, wherein said undercoating insulating film has a flat surface.

12. A method according to claim 9, wherein said substrate is continuously heated while the surface of said undercoating insulating film is exposed to said fourth silicon-containing gas.

13. A method according to claim 9, wherein said third silicon-containing gas is an alkoxy silane or silanol.

14. A method according to claim 9, wherein said third silicon-containing gas and said fourth silicon-containing gas are severally an alkoxy silane or silanol.

15. A method for the production of a semiconductor device comprising the steps of:

forming an undercoating insulating film on a substrate by the use of a mixed gas consisting of an ozone-containing gas having ozone contained in oxygen in a concentration of not less than 4% and a first silicon-containing gas;

exposing the surface of said undercoating insulating film to a second silicon-containing gas thereby reforming said surface; and forming an insulating film on said reformed undercoating insulating film.

16. A method according to claim 15, wherein said insulating film on said reformed undercoating insulating film is a silicon-containing insulating film formed by the use of a mixed gas consisting of said ozone-containing gas and said first silicon-containing gas.

17. A method according to claim 15, wherein said step for forming said undercoating insulating film, said step for reforming the surface of said undercoating insulating film, and said step for forming said insulating film are continuously carried out.

18. A method for the production of a semiconductor device comprising the steps of:

forming an undercoating insulating film on a substrate by the use of a mixed gas consisting of a first ozone-containing gas having ozone contained in oxygen in a concentration of not less than 4% and a third silicon-containing gas;

reforming the surface of said undercoating insulating film by exposing said surface to a mixed gas consisting of a fourth ozone-containing gas having ozone contained in oxygen in a concentration of not more than 1% and a third silicon-containing gas; and forming an insulating film on said reformed undercoating insulating film.

19. A method according to claim 18, wherein said insulating film on said reformed undercoating insulating film is a silicon-containing insulating film formed by the use of a mixed gas consisting of said first ozone-containing gas and said third silicon-containing gas.

20. A method according to claim 18, wherein said step of forming said undercoating insulating film, said step of reforming the surface of said undercoating insulating film, and said step of forming said insulating film are continuously carried out.

* * * * *